US011335555B2

(12) United States Patent
Cheng et al.

(10) Patent No.: US 11,335,555 B2
(45) Date of Patent: May 17, 2022

(54) METHODS FOR CONFORMAL DOPING OF THREE DIMENSIONAL STRUCTURES

(71) Applicant: Applied Materials, Inc., Santa Clara, CA (US)

(72) Inventors: Rui Cheng, Santa Clara, CA (US); Yi Yang, San Jose, CA (US); Karthik Janakiraman, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/045,323

(22) PCT Filed: Apr. 5, 2019

(86) PCT No.: PCT/US2019/026196
§ 371 (c)(1),
(2) Date: Oct. 5, 2020

(87) PCT Pub. No.: WO2019/195809
PCT Pub. Date: Oct. 10, 2019

(65) Prior Publication Data
US 2021/0175070 A1 Jun. 10, 2021

Related U.S. Application Data

(60) Provisional application No. 62/653,925, filed on Apr. 6, 2018.

(51) Int. Cl.
*H01L 21/00* (2006.01)
*H01L 21/02* (2006.01)
*H01L 21/285* (2006.01)
*H01L 21/324* (2006.01)
*H01L 21/225* (2006.01)

(52) U.S. Cl.
CPC .... *H01L 21/0262* (2013.01); *H01L 21/02208* (2013.01); *H01L 21/02362* (2013.01); *H01L 21/2254* (2013.01); *H01L 21/285* (2013.01); *H01L 21/324* (2013.01)

(58) Field of Classification Search
None
See application file for complete search history.

(56) References Cited

U.S. PATENT DOCUMENTS

| 5,807,788 A * | 9/1998 | Brodsky ........... H01L 21/76897 438/653 |
| 9,704,758 B2 | 7/2017 | Bao et al. |
| 2014/0167264 A1* | 6/2014 | Besser ............. H01L 21/28518 257/741 |
| 2017/0170027 A1* | 6/2017 | Hou ................... H01L 21/3215 |
| 2020/0194571 A1 | 6/2020 | Cheng et al. |

* cited by examiner

Primary Examiner — Reema Patel
(74) Attorney, Agent, or Firm — Servilla Whitney LLC

(57) ABSTRACT

Methods of conformally doping three dimensional structures are discussed. Some embodiments utilize conformal silicon films deposited on the structures. The silicon films are doped after deposition to comprise halogen atoms. The structures are then annealed to dope the structures with halogen atoms from the doped silicon films.

20 Claims, 2 Drawing Sheets

METHODS FOR CONFORMAL DOPING OF THREE DIMENSIONAL STRUCTURES

CROSS-REFERENCE TO RELATED APPLICATIONS

This application is the National Stage entry of PCT/US2019/026196, filed on Apr. 5, 2019, which claims priority to U.S. Provisional Application Ser. No. 62/653,925, filed Apr. 6, 2018, the entire disclosures of which are hereby incorporated by reference.

FIELD

Embodiments of the disclosure generally relate to the fabrication of semiconductors, including processes for doping three dimensional structures. More particularly, embodiments of the disclosure are directed to methods for doping high-k layers with halogen atoms.

BACKGROUND

Three dimensional field effect transistors (FETs) have recently been introduced as a way of improving gate control by increasing gate-channel coupling. In so doing, off-state current and short-channel effects can be reduced.

One challenge is forming uniform doping of the 3D structures. Previously, methods for forming conformal doping in a Si channel by conformal deposition have been disclosed. However, high-K dielectrics may also suffer from high densities of interfacial and bulk defects. These defects may increase carrier scattering, degrade mobility, and reduce drain current.

Fluorine doping is able to reduce defect densities in high-k dielectrics by effectively passivating interfacial dangling bonds and bulk oxygen vacancies. In turn, these modifications may reduce oxide leakage currents, improve stability of threshold voltages, and improve device performance. However, fluorine is conventionally doped by ion implantation methods which may damage FinFET fins and may be ineffective for introducing fluorine atoms uniformly across the entire three-dimensional geometry of the FinFET fins.

Therefore, there is a need in the art for methods for conformally doping three dimensional structures.

SUMMARY

One or more embodiments of the disclosure are directed to a substrate processing method. The method comprises depositing a substantially conformal silicon film on a three dimensional structure formed on a substrate. The substrate is exposed to a metal halide to form a capping layer comprising metal and halogen atoms. The substrate is annealed to diffuse halogen atoms below the capping layer and dope the three dimensional structure with halogen atoms. The capping layer is removed from the substrate.

Additional embodiments of the disclosure are directed to substrate processing methods comprising depositing a substantially conformal silicon film on a FinFET structure formed on a substrate. The FinFET structure comprises a layered stack with at least an interlayer dielectric layer, a high-k layer and a nitride layer. The substrate is exposed to $WF_6$ to form a capping layer comprising tungsten and fluorine atoms. The substrate is annealed to diffuse fluorine atoms into the high-k layer and dope the high-k layer with fluorine atoms in a range of about 0 to about 25 atomic percent. The capping layer is removed from the substrate.

Further embodiments of the disclosure are directed to substrate processing methods comprising depositing a substantially conformal silicon film on a FinFET structure formed on a substrate by exposing the substrate to a silicon precursor. The silicon precursor comprises at least one species with a general formula of $Si_xH_y$, where x is an integer 1 to 4 and y is 2x+2. The FinFET structure comprises a layered stack with at least an interlayer dielectric layer comprising SiO, a high-k layer comprising HfO and a nitride layer comprising TiN. The substrate is exposed to $WF_6$ to form a capping layer comprising tungsten and fluorine atoms. The substrate is annealed at a temperature in a range of about 200° C. to about 1000° C. to diffuse fluorine atoms into the high-k layer and dope the high-k layer with fluorine atoms in a range of about 0 to about 25 atomic percent. The capping layer is removed from the substrate.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
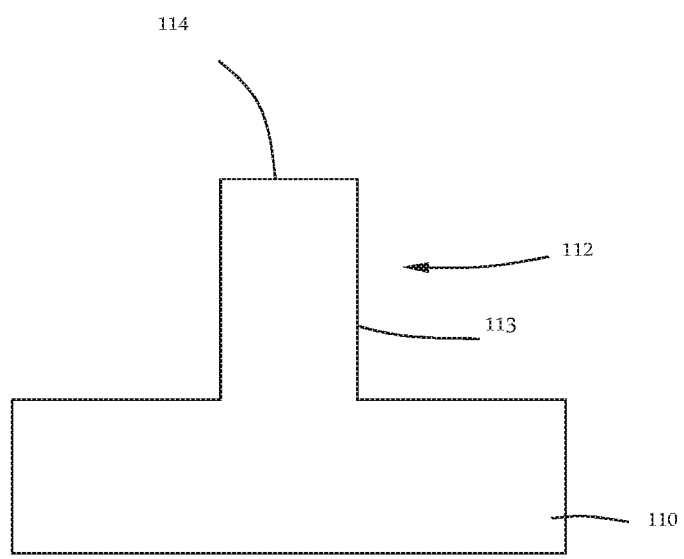
FIG. 1 shows a schematic representation of a substrate with a fin shaped feature thereon in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

Embodiments of the disclosure advantageously provide methods of conformally doping a three dimensional (3D) structure with halogen atoms. Some embodiments advantageously provide methods which conformally dope three dimensional FinFET structures. Some embodiments advantageously provide methods which allow for indirectly doping a capping layer with fluorine. Further, some embodiments advantageously provide conformal doping of a three dimensional structure such that the dopant is present in layers of the structure in approximately equal concentrations regardless of the layer's orientation and position within the structure.

With reference to the Figures, one or more embodiment of the disclosure is directed to a method 100 for conformally doping a three dimensional structure on a substrate. 3D structures may be formed on the substrate by various patterning and etching processes. In some embodiments, the 3D structures are formed with dimensions suitable for implementation as fin field-effect transistors (FinFETs) in complimentary metal-oxide semiconductor (CMOS) transistors. However, other transistor types may also benefit from the embodiments described herein. In some embodiments, the 3D structures may be suitable for and may have dimensions commensurate for utilization in current technology nodes and advanced technology nodes, such as a sub-10 nm node.

Fin Field Effect Transistors, also known as a FinFETs, are well known by those skilled in the art. FinFETs are a type of non-planar or three dimensional transistor used in the design of modern processors. As in earlier, planar designs, they are typically built on an SOI (silicon on insulator) substrate. However, FinFET designs also use a conducting channel that rises above the level of the insulator, creating a thin silicon-based structure, shaped like a fin, which is called a gate electrode. This fin-shaped electrode allows multiple gates to operate on a single transistor. FinFET devices may also advantageously provide faster switching times and higher current density than mainstream CMOS technologies.

FIG. 1 illustrates a substrate 110 with a fin 112 formed thereon. The fin 112 comprises at least one sidewall 113 and a top 114. The fin 112 of some embodiments is a rectangular prism-shaped object with elongated sidewalls connected by shorter end walls (not shown). In some embodiments, the fin 112 is a cylindrical object with one round sidewall and a top.

Figure 2:
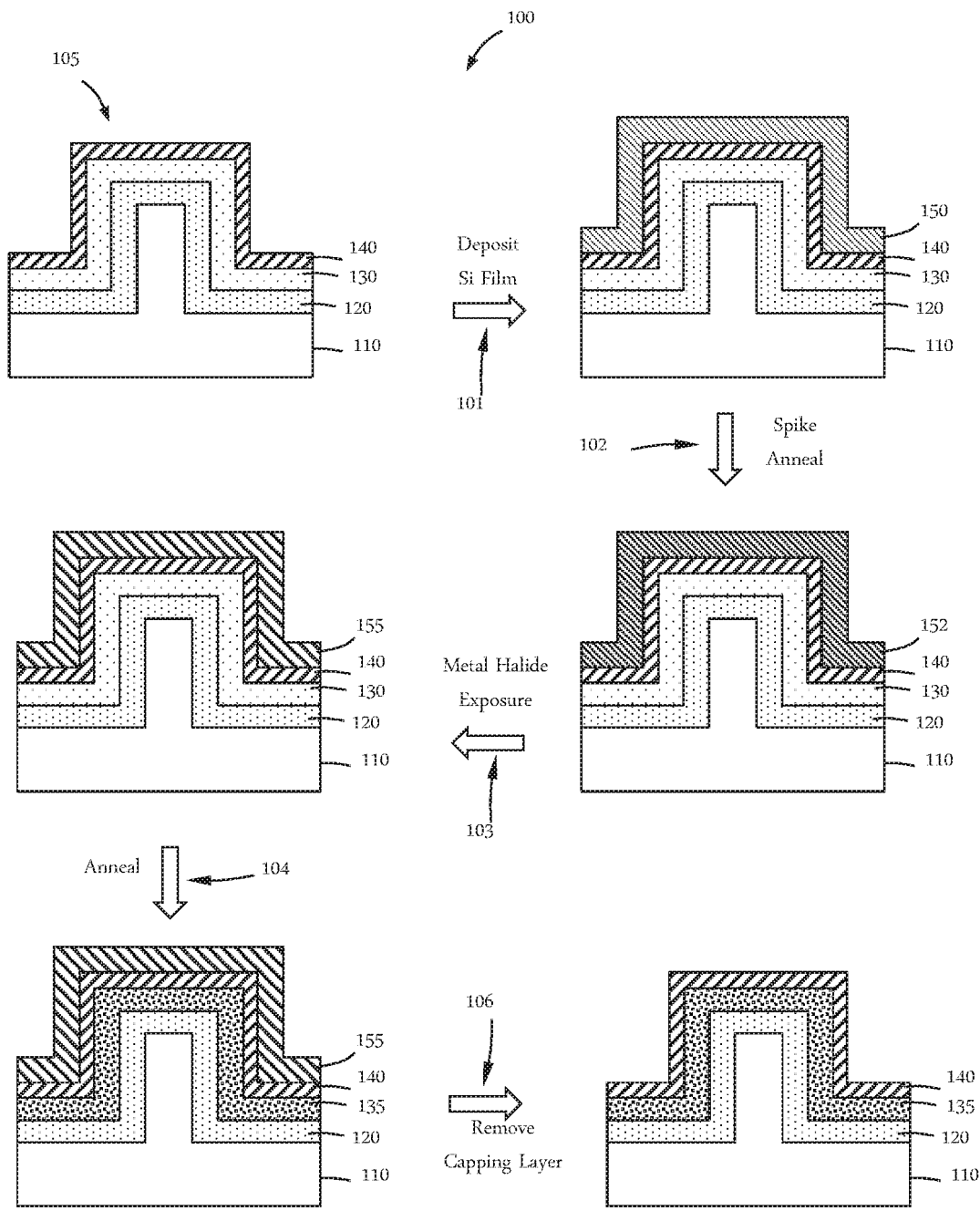
FIG. 2 illustrates schematic representations of a substrate undergoing processing in accordance with one or more embodiment of the disclosure.

Referring to FIG. 2, the method 100 starts with providing a substrate 110. The substrate 110 has a three dimensional structure formed thereon. In some embodiments, the three dimensional structure comprises a layered stack 105. The layered stack 105105 comprises a dielectric layer 120, a high-k layer 130 and a nitride layer 140. In some embodiments, the layered stack 105 is structured, as shown in FIG. 2, with the dielectric layer 120 on the substrate 110, the high-k layer 130 on the dielectric layer 120 and the nitride layer 140 on the high-k layer 130. The individual layers illustrated in FIG. 2 are shown as generally conformal in shape (i.e. having uniform thickness on top, sides and bottom of features); however, the skilled artisan will recognize that this is merely representative of one possible configuration and any or all of the films can be non-conformal.

In one or more embodiments, a substrate 110 with a layered stack 105 is provided for processing. As used in this manner, "provided" means that the substrate is placed into position or a suitable environment for processing. In some embodiments, the method further comprises forming the layered stack 105 on the substrate 110. These methods comprise forming a dielectric layer 120 on the substrate 110, forming a high-k layer 130 on the dielectric layer 120, and then forming a nitride layer 140 on the high-k layer 130. The dielectric layer 120, the high-k layer 130 and the nitride layer 140 can be formed by any suitable technique known to the skilled artisan. Suitable techniques include, but are not limited to, spin-on techniques, chemical vapor deposition (CVD), atomic layer deposition (ALD), plasma enhanced CVD, plasma enhanced ALD and physical vapor deposition (PVD). The skilled artisan will be familiar with the various deposition processes and techniques and further description of these processes is not included.

The embodiment illustrated in FIG. 2 has a distinct dielectric layer 120 relative to the substrate 110. However, the skilled artisan will recognize that the dielectric layer 120 can be the substrate 110 or a portion of the substrate 110. For example, the high-k layer 130 can be formed on the substrate 110 to form a part of the layered stack 105. In some embodiments, the dielectric layer 120 is a different layer than the substrate 110.

The layered stack 105 is formed on a substrate 110 which can be any suitable material or shape. For simplicity, in the illustrated embodiment, the substrate 110 is shown with one fin, or feature, on the surface. This is merely representative of one exemplary embodiment and the skilled artisan will understand that the substrate 110 can have one or more features (i.e., fins, trenches or vias), structures, or other abnormalities, and that the layered stack 105 can be formed to conform to the shape of the surface of the substrate 110.

In some embodiments, the dielectric layer 120 can be formed by oxidation of the surface of the substrate 110. In some embodiments, the dielectric layer 120 can be deposited or formed as a film on the substrate. The dielectric layer 120 can be any suitable material including, but not limited to, silicon oxide. It should be understood that the term "silicon oxide" does not convey any ratio, stoichiometric or otherwise, between the elements. In some embodiments, the dielectric layer 120 comprises silicon (Si) and oxygen (O) atoms. In some embodiments, the dielectric layer 120 consists essentially of silicon and oxygen atoms. In some embodiments, the dielectric layer 120 consists essentially of silicon dioxide ($SiO_2$). As used in this specification and the appended claims, the term "consists essentially of" means that the bulk composition (not including any interface regions) of the subject film is greater than or equal to about 95%, 98%, 99% or 99.5% of the specified material on an atomic basis. For example, a film consisting essentially of silicon oxide will have the sum of silicon and oxygen atoms greater than or equal to 95% of the total atoms.

The dielectric layer 120 of some embodiments is a native oxide on the substrate 110. For example, a silicon substrate may oxidize in air to form a native oxide layer on the silicon. In some embodiments, the thickness of the dielectric layer 120 is less than or equal to about 20 Å, less than or equal to about 15 Å, less than or equal to about 10 Å, or less than or equal to about 5 Å. In some embodiments, the dielectric layer 120 has a thickness in the range of about 3 Å to about 20 Å, in the range of about 5 Å to about 15 Å, in the range of about 5 Å to about 10 Å or in the range of about 10 Å to about 15 Å.

In some embodiments, the high-k layer 130 is formed or deposited on the dielectric layer 120. The high-k layer 130 can be any suitable high-k dielectric including, but not limited to, hafnium oxide. In some embodiments, the high-k layer consists essentially of Hf and O. In some embodiments, the high-k layer consists essentially of $HfO_2$.

In some embodiments, the high-k layer comprises a material with a dielectric constant greater than or equal to 4, greater than or equal to about 5, greater than or equal to about 6, greater than or equal to about 10, or greater than or equal to about 20.

In some embodiments, the thickness of the high-k layer 130 is in the range of about 5 Å to about 30 Å. In some embodiments, the thickness of the high-k layer 130 is in the range of about 10 Å to about 25 Å.

The high-k layer 130 can be formed by any suitable process. In some embodiments, the high-k layer 130 is deposited by atomic layer deposition (ALD) or chemical vapor deposition (CVD) using a hafnium precursor (e.g., tetrakis(dimethylamido)hafnium) and an oxidizing agent (e.g., $O_3$, $O_2$ or $H_2O$). In some embodiments, the high-k layer 130 is deposited by a process which utilizes a plasma reactant.

In some embodiments, the nitride layer 140 is formed or deposited on the high-k layer 130. The nitride layer 140 can be any suitable material comprising a metal and nitrogen, including but not limited to, titanium nitride. In some embodiments, the nitride layer comprises Ti or Ta. In some embodiments, the nitride layer further comprises silicon. In some embodiments, the nitride layer comprises or consists essentially of one or more of TiN, TiSiN, TaN, or TaSiN.

In some embodiments, the thickness of the nitride layer 140 is in the range of about 5 Å to about 30 Å. In some embodiments, the thickness of the nitride layer 140 is in the range of about 10 Å to about 25 Å.

Referring again to FIG. 2, the method 100 begins with depositing 101 a silicon film 150 on the three dimensional structure (i.e., fin 112) formed on the substrate 110. The silicon film 150 is substantially conformal to the substrate surface including the surface(s) of the three dimensional structure formed thereon. As used in this regard, the term "conformal" means that the thickness of the silicon film is uniform across the substrate surface. As used in this specification and the appended claims, the term "substantially conformal" means that the thickness of the film does not vary by more than about 10%, 5%, 2%, 1%, or 0.5% relative to the average thickness of the film.

The silicon film 150 may be any suitable material comprising silicon. In some embodiments, the silicon film 150 is an amorphous silicon film. As used in this regard, an amorphous film has a volume percent crystallinity of less than or equal to about 10%, or less than or equal to about 5%, or less than or equal to about 2%, or less than or equal to about 1%, or less than or equal to about 0.5%, or less than or equal to about 0.2%, or less than or equal to about 0.1% of the total volume of the film.

The silicon film 150 can be deposited by any suitable method. In some embodiments, the silicon film 150 is deposited by chemical vapor deposition (CVD). In some embodiments, depositing the silicon film comprises exposing the substrate to a silicon precursor. In some embodiments, the silicon precursor comprises at least one species with a general formula of $Si_xH_y$, where x is an integer from 1 to 4 and y is 2x+2. In some embodiments, the silicon precursor is silane, disilane, trisilane, tetrasilane, or combinations thereof. The silicon film 150 may be formed to any suitable thickness. In some embodiments, the silicon film 150 has a thickness in the range of about 10 Å to about 50 Å, about 15 Å to about 40 Å, or about 20 Å to about 30 Å.

In some embodiments, the temperature of the substrate is maintained while the silicon film 150 is deposited. In some embodiments, the substrate is maintained at a temperature in the range of about 400° C. to about 550° C., about 425° C. to about 500° C., about 450° C. to about 500° C. In some embodiments, the substrate is maintained at a temperature greater than or equal to about 400° C., greater than or equal to about 450° C., or greater than or equal to about 500° C. In some embodiments, the substrate is maintained at a temperature less than or equal to about 550° C., less than or equal to about 500° C., or less than or equal to about 450° C.

After the silicon film 150 has been deposited, the method 100 may continue with an anneal process 102 to form a spike annealed silicon film 152. In some embodiments, the substrate 110 is annealed by a spike anneal process or rapid thermal anneal process. In some embodiments, the substrate 110 is heated to a temperature in the range of about 500° C. to about 1000° C. In some embodiments, the substrate is heated to a temperature greater than or equal to about 500° C., greater than or equal to about 600° C., greater than or equal to about 700° C., greater than or equal to about 800° C., or greater than or equal to about 1000° C. In some embodiments, the temperature of the substrate 110 is increased by a rate greater than or equal to about 25° C./sec or 50° C./sec.

In some embodiments, the spike anneal process 102 heats the substrate for a period of about 1 millisecond to about 10 seconds. The spike anneal process may be performed under any suitable atmosphere. In some embodiments, the spike anneal process is performed under a nitrogen ($N_2$) atmosphere.

The method 100 continues by exposing the substrate to a metal halide at 103 to convert the spike annealed silicon film 152 to capping layer 155 comprising metal and halogen atoms. In some embodiments, the metal halide comprises tungsten (W). In some embodiments, the metal halide comprises one or more of fluorine (F) or chlorine (Cl). In some embodiments, the metal halide consists essentially of $WF_6$.

In some embodiments, the capping layer 155 is formed by converting the spike annealed silicon film 152 to a capping layer 155. In some embodiments, the conversion process involves substituting silicon atoms of the silicon film 150 with atoms of the metal halide to form the capping layer 155 without spike annealing to form the spike annealed silicon film 152. In some embodiments, the capping layer 155 comprises metal atoms and halogen atoms. In some embodiments, the capping layer 155 further comprises silicon.

In some embodiments, the metal halide is delivered to the substrate by co-flowing the metal halide with a carrier gas. In some embodiments, the carrier gas comprises nitrogen ($N_2$), argon (Ar), or combinations thereof. In some embodiments, the carrier gas comprises substantially no hydrogen gas ($H_2$). As used in this specification and the appended claims, the term "comprises substantially no" means that the stated material (e.g. the carrier gas) contains less than or equal to about 2%, 1%, 0.5%, 0.2% or 0.1% of the specified material. Without being bound by theory, some embodiments minimize the amount of reduction of the metal halide to metal by avoiding the presence of $H_2$ or other reducing agents. In this way, an increased concentration of fluorine or other halogen atoms is present in the capping layer. In some embodiments, the capping layer comprises W and halogen atoms. In some embodiments, the capping layer further comprises Si atoms. In some embodiments, the capping layer consists essentially of W and halogen atoms. In some embodiments, the capping layer consists essentially of W, F and Si atoms.

The temperature at which the substrate is exposed to the metal halide can be varied depending on, for example, the thermal budget of the device being formed and the metal halide selected. In some embodiments, exposure to the metal halide occurs at a temperature in the range of about 100° C. to about 500° C. In one or more embodiments, the substrate is exposed at a temperature in the range of about 150° C. to about 475° C., or in the range of about 200° C. to about 450° C., in the range of about 300° C. to about 425° C., or in the range of about 350° C. to about 400° C. In some embodiments, the substrate is exposed to the metal halide at a temperature less than or equal to about 500° C. and greater than or equal to about 100° C., greater than or equal to about 150° C., greater than or equal to about 200° C., greater than or equal to about 250° C., or greater than or equal to about 300° C.

The pressure at which the substrate surface is exposed to the metal halide can be varied depending on, for example, the metal halide selected and other process conditions. In some embodiments, exposure to each of the precursors occurs at a pressure in the range of about 0.1 Torr to about 100 Torr. In one or more embodiments, the substrate is exposed at a pressure in the range of about 0.1 Torr to about 100 Torr, or in the range of about 1 Torr to about 80 Torr, or in the range of about 10 Torr to about 60 Torr. In some embodiments, the substrate is exposed at a pressure greater than or equal to about 0.1 Torr and less than or equal to about 100 Torr, less than or equal to about 80 Torr, less than or equal to about 60 Torr, less than or equal to about 40 Torr, or less than or equal to about 25 Torr.

The method 100 continues by annealing 104 the substrate 110 to diffuse halogen atoms below the capping layer 155 and dope the three dimensional structure with halogen atoms. In some embodiments, the three dimensional structure comprises a layered stack 105 comprising a high-k layer 130 and the halogen atoms are diffused into the layered stack 105 to dope the high-k layer 130 with halogen atoms forming a doped high-k layer 135.

In some embodiments, annealing the substrate diffuses the halogen atoms from the capping layer 155 through the nitride layer 140 and into the high-k layer 130. In some embodiments, the doped high-k layer 135 has a concentration of halogen atoms in a range of greater than 0 atomic percent to less than or equal to about 25 atomic percent. In some embodiments, the doped high-k layer 135 has a concentration of halogen atoms less than or equal to about 25 atomic percent and greater than or equal to about 2 atomic percent, greater than or equal to about 5 atomic percent, greater than or equal to about 10 atomic percent, greater than or equal to about 15 atomic percent, or greater than or equal to about 20 atomic percent.

In some embodiments, annealing the substrate does not diffuse W or Si atoms from the capping layer 155 through the nitride layer 140 and into the high-k layer 130. In some embodiments, some Si atoms may diffuse from the capping layer 155 into the nitride layer 140 or the high-k layer 130. In certain embodiments where Si atoms are diffused into the nitride layer 140 and/or the high-k layer 130, the concentration of Si atoms increases by less than 5 atomic percent, less than 2 atomic percent or less than 1 atomic percent.

The temperature at which the substrate is annealed can be varied depending on, for example, the thermal budget of the device being formed and the desired concentration of halogen doping in the high-k layer. Similarly, the duration of the anneal can be varied depending on, for example, the thermal budget of the device being formed and the desired concentration of halogen doping in the high-k layer. In some embodiments, annealing the substrate occurs at a temperature in the range of about 200° C. to about 1000° C. In one or more embodiments, the substrate is exposed at a temperature in the range of about 250° C. to about 900° C., or in the range of about 300° C. to about 800° C., or in the range of about 350° C. to about 700° C. In some embodiments, the substrate is annealed at a temperature less than or equal to about 1000° C. and greater than or equal to about 200° C., greater than or equal to about 300° C., greater than or equal to about 400° C., greater than or equal to about 500° C., greater than or equal to about 600° C., greater than or equal to about 700° C., greater than or equal to about 800° C., or greater than or equal to about 900° C.

The anneal process may be carried out under any suitable conditions. In some embodiments, annealing is performed under an inert gas atmosphere. The inert gas of some embodiments comprises one or more of nitrogen ($N_2$), helium (He), neon (Ne), argon (Ar), krypton (Kr) or xenon (Xe). In some embodiments, the inert gas consists essentially of nitrogen ($N_2$).

The inventors have found that the concentration of fluorine or other halogen atoms within the doped high-k layer 135 can be controlled to a predetermined level. In some embodiments, the concentration of fluorine or other halogen atoms can be controlled by controlling the concentration of fluorine or other halogen atoms within the capping layer 155 before annealing, and/or the temperature, duration and/or atmospheric conditions of the anneal process. In some embodiments, the concentration of fluorine or other halogen atoms within the capping layer 155 can be controlled by controlling the temperature, pressure, gas flow rates, selection of a carrier gas or other process conditions of the metal halide based substitution process.

Without being bound by theory, it is believed that in some embodiments, the anneal process 104 allows for halogen atoms from the capping layer 155 to migrate through the nitride layer 140 to the high-k layer 130 due to the small atomic radius of the halogen atoms in the capping layer 155. Ultimately, the presence of these halogen atoms in the doped high-k layer 135 modifies the threshold voltage of the layered stack 105.

The method 100 continues by removing 106 the capping layer 155 from the substrate 110. The capping layer 155 may be removed by any suitable process, including but not limited to, chemical etch processes, mechanical processes, wet processes, dry processes and combinations thereof. In some embodiments, the process used to remove the capping layer 155 also removes a portion of the nitride layer 140. In some embodiments, the nitride layer 140 may be redeposited or reformed after removing the capping layer 155.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A substrate processing method comprising:
depositing a conformal silicon film on a three dimensional structure formed on a substrate;
exposing the silicon film to a metal halide to form a capping layer comprising metal and halogen atoms;
annealing the capping layer to diffuse halogen atoms from the capping layer and dope the three dimensional structure with the halogen atoms of the capping layer; and
removing the capping layer.

2. The method of claim 1, wherein the three dimensional structure comprises a FinFET structure.

3. The method of claim 1, wherein the three dimensional structure comprises a layered stack, the layered stack comprising a dielectric layer, a high-k layer and a nitride layer.

4. The method of claim 3, wherein the dielectric layer comprises silicon and oxygen.

5. The method of claim 3, wherein the high-k layer comprises Hf and O.

6. The method of claim 3, wherein the nitride layer comprises one or more of TiN, TiSiN, TaN, or TaSiN.

7. The method of claim 1, wherein depositing the silicon film comprises exposing the substrate to a silicon precursor, the silicon precursor comprising at least one species with a general formula of $Si_xH_y$, where x is an integer from 1 to 4 and y is 2x+2.

8. The method of claim 7, wherein the substrate is maintained at a temperature in a range of 400° C. to 550° C.

9. The method of claim 1, further comprising annealing the substrate after depositing the silicon film.

10. The method of claim 9, wherein the silicon film is annealed at a temperature in a range of 500° C. to 1000° C. for a period in a range of 1 ms to 10 s.

11. The method of claim 1, wherein the metal halide comprises W.

12. The method of claim 1, wherein the metal halide comprises one or more of F or Cl.

13. The method of claim 1, wherein the metal halide consists essentially of $WF_6$.

14. The method of claim 1, wherein the substrate is maintained at a temperature of 100° C. to 500° C. while the substrate is exposed to the metal halide.

15. The method of claim 1, wherein the capping layer further comprises silicon.

16. The method of claim 1, wherein the substrate is maintained at a temperature of 200° C. to 1000° C. while the substrate is annealed to diffuse halogen atoms below the capping layer.

17. The method of claim 1, wherein the capping layer is removed by an etch process.

18. A substrate processing method comprising:
depositing a conformal silicon film on a FinFET structure formed on a substrate, the FinFET structure comprising a layered stack with at least an interlayer dielectric layer, a high-k layer and a nitride layer;
exposing the silicon film to $WF_6$ to form a capping layer comprising tungsten and fluorine atoms;
annealing the capping layer to diffuse fluorine atoms from the capping layer into the high-k layer doping the high-k layer with an atomic percent of fluorine atoms in a range of greater than 0 to less than or equal to 25; and
removing the capping layer.

19. The method of claim 18, wherein removing the capping layer comprises removing the capping layer and a portion of the nitride layer and reforming the nitride layer.

20. A substrate processing method comprising:
depositing a conformal silicon film on a FinFET structure formed on a substrate by exposing the substrate to a silicon precursor, the silicon precursor comprising at least one species with a general formula of $Si_xH_y$, where x is an integer 1 to 4 and y is 2x+2, the FinFET structure comprising a layered stack with at least an interlayer dielectric layer comprising SiO, a high-k layer comprising HfO and a nitride layer comprising TiN;
exposing the silicon film to $WF_6$ to form a capping layer comprising tungsten and fluorine atoms;
annealing the capping layer at a temperature in a range of 200° C. to 1000° C. to diffuse fluorine atoms from the capping layer into the high-k layer doping the high-k layer with an atomic percentage of fluorine atoms in a range of greater than 0 to less than or equal to 25; and
removing the capping layer.

* * * * *